US012144232B2

(12) United States Patent
He

(10) Patent No.: US 12,144,232 B2
(45) Date of Patent: Nov. 12, 2024

(54) DISPLAY PANEL AND DISPLAY DEVICE WITH IMPROVED SHRINKAGE PERFORMANCE OF CURVED REGIONS

(71) Applicant: Wuhan China Star Optoelectronics Semiconductor Display Technology Co., Ltd., Wuhan (CN)

(72) Inventor: Ping He, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/605,060

(22) PCT Filed: Aug. 6, 2021

(86) PCT No.: PCT/CN2021/111186
§ 371 (c)(1),
(2) Date: Oct. 20, 2021

(87) PCT Pub. No.: WO2023/010527
PCT Pub. Date: Feb. 9, 2023

(65) Prior Publication Data
US 2024/0023411 A1    Jan. 18, 2024

(30) Foreign Application Priority Data
Aug. 2, 2021  (CN) .......................... 202110879856.0

(51) Int. Cl.
*H10K 59/80* (2023.01)

(52) U.S. Cl.
CPC .................... *H10K 59/873* (2023.02)

(58) Field of Classification Search
None
See application file for complete search history.

(56) References Cited

U.S. PATENT DOCUMENTS

| 2017/0031472 A1 | 2/2017 | Ma | |
| 2017/0301742 A1* | 10/2017 | Jeong | H10K 59/131 |
| 2019/0081255 A1 | 3/2019 | Kim | |
| 2019/0269011 A1* | 8/2019 | Lee | H05K 3/0014 |

(Continued)

FOREIGN PATENT DOCUMENTS

| CN | 108766977 A | 11/2018 |
| CN | 111540279 A | 8/2020 |
| CN | 111627332 A | 9/2020 |

(Continued)

*Primary Examiner* — Daniel Whalen
(74) *Attorney, Agent, or Firm* — Nathan & Associates; Menachem Nathan

(57) ABSTRACT

The present application provides a display panel and a display device. The display panel comprises a first curved region located between two second curved regions and corresponding to a corner area of a planar region. The display panel comprises a supporting layer and a panel main body, and the supporting layer comprises a first portion being bent and within the first curved region and a second portion being bent and within the second curved region; the panel main body is disposed on the first portion and the second portion and bent along with the first portion and the second portion. a shrinkage rate of the first portion is greater than a shrinkage rate of the second portion.

16 Claims, 4 Drawing Sheets

(56) References Cited

U.S. PATENT DOCUMENTS

2022/0308625 A1* 9/2022 Gao, Sr. ................ G06F 1/1628
2024/0057442 A1* 2/2024 He ....................... H10K 59/872

FOREIGN PATENT DOCUMENTS

| CN | 111816078 A | 10/2020 |
| CN | 112002248 A | 11/2020 |
| CN | 112071884 A | 12/2020 |
| CN | 112165837 A | 1/2021 |
| CN | 112786621 A | 5/2021 |
| CN | 112991953 A | 6/2021 |

* cited by examiner

DISPLAY PANEL AND DISPLAY DEVICE WITH IMPROVED SHRINKAGE PERFORMANCE OF CURVED REGIONS

FIELD OF INVENTION

The present application relates the field of display technology, and particularly to a display and a display device.

BACKGROUND OF INVENTION

When the curved screen display module performs 3D adhesive process, the redundant part will appear at the corners of the curved surface of the screen, resulting in the problem of adhesive wrinkles and affecting the display effect. In order to avoid adhesive wrinkles, the redundant part will be cut before 3D adhesive process to ensure a shape that meets the requirements of the corners of the curved surface can be formed after the 3D adhesive process. However, the cutting joints at the corners may affect the user's visual experience of the full-screen display.

SUMMARY OF INVENTION

Technical Problems

The embodiments of the present application provide a display panel and a display device, which can improve the adhesive wrinkle issue existing in the first curved region of the display panel.

Technical Solutions

The embodiments of the present application provide a display panel, comprising a planar region, a first curved region, and two second curved regions, wherein the planar region comprises a first side and a second side adjacent to the first side, the two second curved regions are respectively coupled to the first side and the second side, and the first curved region is located between the two curved regions and corresponding to a corner area of the planar region. The display panel comprises a supporting layer and a panel main body. The supporting layer comprises a first portion being bent and within the first curved region and a second portion being bent and within the second curved region. The panel main body is disposed on the first portion and the second portion and bent along with the first portion and the second portion. A shrinkage rate of the first portion is greater than A shrinkage rate of the second portion.

Optionally, according to some embodiments of the present application, the display panel further comprises a transition region located between the first curved region and the second curved regions, and the supporting layer comprises a third portion being bent and corresponding to the transition region; wherein a shrinkage rate of the third portion is less than the shrinkage rate of the first portion and is greater than the shrinkage rate of the second portion.

Optionally, according to some embodiments of the present application, the first portion has a first structure, the third portion has a second structure, the first structure comprises a plurality of first pores, and the second structure comprises a plurality of second pores; and wherein a porosity of the first portion per unit volume is greater than a porosity of the third portion.

Optionally, according to some embodiments of the present application, in the transition region, the pore diameter of a plurality of the second pores gradually decreases in the direction from the first curved region to the second curved region.

Optionally, according to some embodiments of the present application, the pore diameter of each of the second pores is less than the pore diameter of each of the first pores.

Optionally, according to some embodiments of the present application, a center distance of two adjacent first pores is 2 to 5 times of the pore diameter of the first pores.

Optionally, according to some embodiments of the present application, the first pores have different pore diameter, and the first pores comprise a first sub-pore having a minimum pore diameter and a second sub-pore having a maximum pore diameter; wherein the minimum pore diameter is 10% to 50% of the maximum pore diameter, and a center distance of two adjacent second sub-pores is 2 to 5 times of the pore diameter of the maximum pore diameter.

Optionally, according to some embodiments of the present application, the pore diameter of the first pores is less than or equal to 0.1 time of the thickness of the supporting layer.

Optionally, according to some embodiments of the present application, in the transition region, the shrinkage rate of the third portion gradually decreases in the direction from the first curved region to the second curved region.

Optionally, according to some embodiments of the present application, the first structure and the second structure are regular skeletal structures.

Optionally, according to some embodiments of the present application, the first structure comprises a first skeletal structure, and the second structure comprises a second skeletal structure; wherein the variation amplitude of a distance between two adjacent skeletons in the second skeletal structure before and after shrink is less than that of in the first skeletal structure.

Optionally, according to some embodiments of the present application, the distance between two adjacent skeletons in the second skeletal structure gradually decreases in the direction from the first curve region to the second curved region.

Optionally, according to some embodiments of the present application, the variation amplitude of the distance between two adjacent skeletons in the first skeletal structure before and after shrink is less than or equal to 50%.

Optionally, according to some embodiments of the present application, the panel main body comprises a substrate, a driving array layer, and a light emitting device. The substrate is located on the supporting layer, and the driving array layer is located on the substrate. The light emitting device is located on the driving array layer.

Optionally, according to some embodiments of the present application, the light emitting device comprises organic light emitting diode (OLED), Mini LED, or Micro LED.

The embodiment of the present application further provides a display device comprising any of the above-mentioned display panels.

Beneficial Effect

According to the display panel and the display device provided by the present application, the supporting layer is disposed below the panel main body. In the supporting layer, the shrinkage rate of the first portion located in the first curved region is greater than that of the second portion located in the second curved region, so that the shrinkage performance of the display panel in the first curved region is better than that in the second curved region. When performing the 3D adhesive process, the first portion shrinks and deforms to make the panel main body is tightly adhesive to the curved cover plate, and thus the issues of adhesive wrinkles and bubbles can be avoided, which is beneficial to the display panel to achieve a full screen display design with narrow bezel.

DETAILED DESCRIPTION OF EMBODIMENTS

In order to make purposes, technical solutions, and effects of the present application clearer and more specific, the present application is further described in detail below with reference to the accompanying drawings and examples. It should be understood that the specific embodiments described herein are only used to explain the present application, and are not used to limit the present application.

Figure 1A:
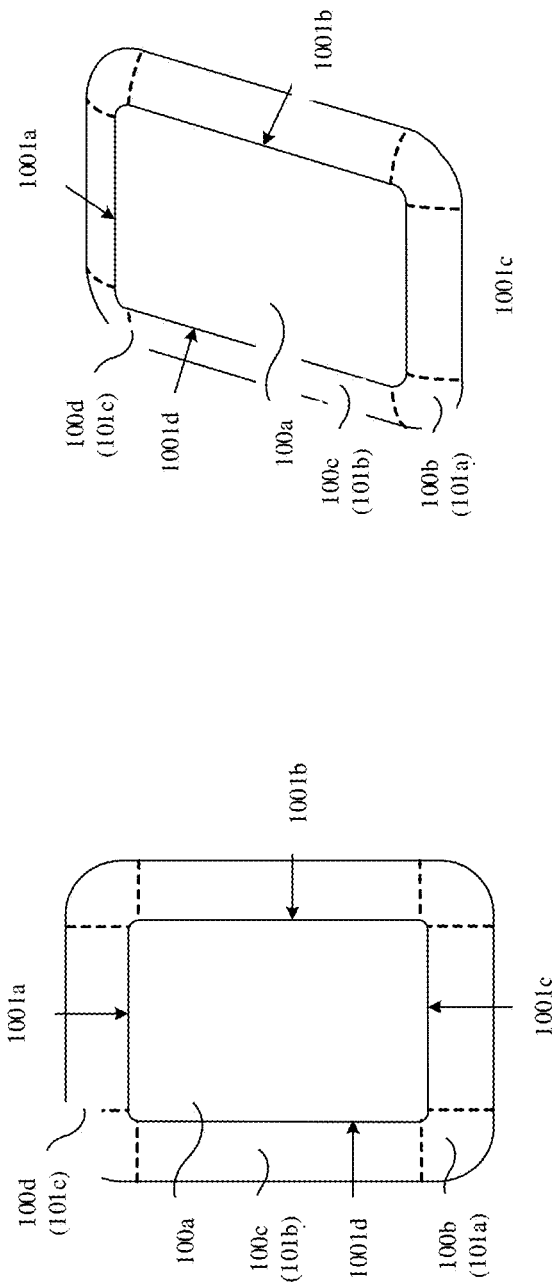
FIG. 1A and FIG. 1B are structural schematic diagrams of a display panel according to an embodiment of the present application.
Figure 1B:
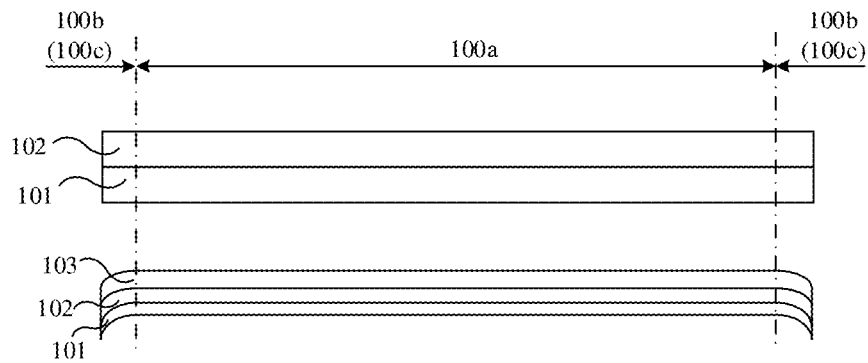

Specifically, FIG. 1A and FIG. 1B are structural schematic diagrams of a display panel according to an embodiment of the present application. The present application provides a display panel, comprising a planar region 100a, a first curved region 100b, a second curved region 100c, and a non-display region.

The planar region 100a comprises a first side 1001a, a second side 1001b, a third side 1001c, and a fourth 1001d, wherein the first side 1001a is adjacent to the second side 1001b, the third side 1001c is adjacent to the second side 1001b and opposite to the first side 1001a, the fourth side 1001d and the first side 1001a are connected to the third side 1001c and opposite to the second side 1001b.

Optionally, the display panel comprises at least two second curved regions 100c respectively connected to the first side 1001a and the second side 1001b. Further, the display panel comprises at least one first curved region 100b located between the two second curved regions 100c and corresponding to a corner area of the planar region 100a.

Optionally, the display panel comprises three second curved regions 100c respectively connected to the first side 1001a, the second side 1001b, and the third side 1001c. Further, the display panel comprises two first curved regions 100b, and each of the first curved regions 100b is located between two of the second curved regions 100c and corresponding to the corner area of the planar region 100a.

Optionally, the display panel comprises four second curved regions 100c respectively connected to the first side 1001a, the second side 1001b, the third side 1001c, and the fourth side 1001d. Further, the display panel comprises four first curved regions 100b, and each of the first curved regions 100b is located between two of the second curved regions 100c and corresponding to the corner area of the planar region 100a.

The non-display region is located at the periphery of the first curved region 100b and the second curved regions 100c.

The planar region 100a, the first curved region 100b, and the second curved regions 100c are the area configured to implement the display function for the display panel.

Further refer to FIG. 1A and FIG. 1B, the display panel comprises a supporting layer 101 and a panel main body 102.

The supporting layer 101 comprises a first portion 101a in the first curved region 100b and a second portion 101b in the second curved region 100c.

The panel main body 102 is located on the supporting layer 101, that is, the panel main body 102 is disposed on the first portion 101a and the second portion 101b.

The shrinkage rate of the first portion 101a is greater than the shrinkage rate of the second portion 101b, so that the shrinkage performance of the first portion 101a is better than that of the second portion 101b. Thus, the panel main body 102 at the first curved region 100b can be tightly adhesive to a curved cover plate 103 by the shrinkage of the first portion during the 3D adhesive process, so as to avoid the occurrence of wrinkles. In addition, the shrinkage of the first portion 101a makes the visually perceived width of the non-display region smaller, which can improve the user's visual experience and is beneficial to the display panel to achieve a full screen display design with narrow bezel.

Further, the shrinkage rate of the first portion 101a can be determined by factors such as the size of the display panel and the shape of the first curved region 100b after the 3D adhesive process. Specifically, the larger the size of the display panel, the smaller the size proportion of the first curved region 100b, and the smaller the shrinkage rate of the first portion 101a, and the larger the size proportion of the first curved region 100b, the larger the shrinkage rate of the first portion 101a, correspondingly. The greater the curvature of the cambered surface formed by the first curved region 100b after the 3D adhesive process, the greater the shrinkage rate of the first portion 101a, and the smaller the curvature of the cambered surface formed by the first curved region 100b after the 3D adhesive process, the smaller the shrinkage rate of the first portion 101a.

In the case that the large-size display panel and the small-size display panel both contain the same area of the first curved region 100b, the size proportion of the first curved region 100b in the small-size display panel is larger than that in the large-size display panel. Therefore, the shrinkage rate of the first portion 101a in the small-size display panel can be greater than that of the first portion 101a in the large-size display panel. For example, in the small-size display panel (e.g., 7 inches or less), the maximum shrinkage rate of the first portion 101a can be 10% to 20%; in the large-size display panel (e.g., over inches), the shrinkage rate of the first portion 101a can be 10% to 20%. The maximum shrinkage rate of the first portion 101a can be 5%.

The shrinkage rate of the first portion 101a can be calculated based on the area changes of the supporting layer 101 before and after the 3D adhesive process. It will not be repeated herein.

For the shrinkage rate of the first portion 101a to be greater than that of the second portion 101b, the first portion 101a has a first structure. Optionally, the first structure can be a uniformly distributed porous structure, a regular skeletal structure, or an irregular fibrous structure. Specifically, FIG. 2A and FIG. 2B are two-dimensional structural schematic diagrams of a supporting layer according to an embodiment of the present application.

Figure 2A:
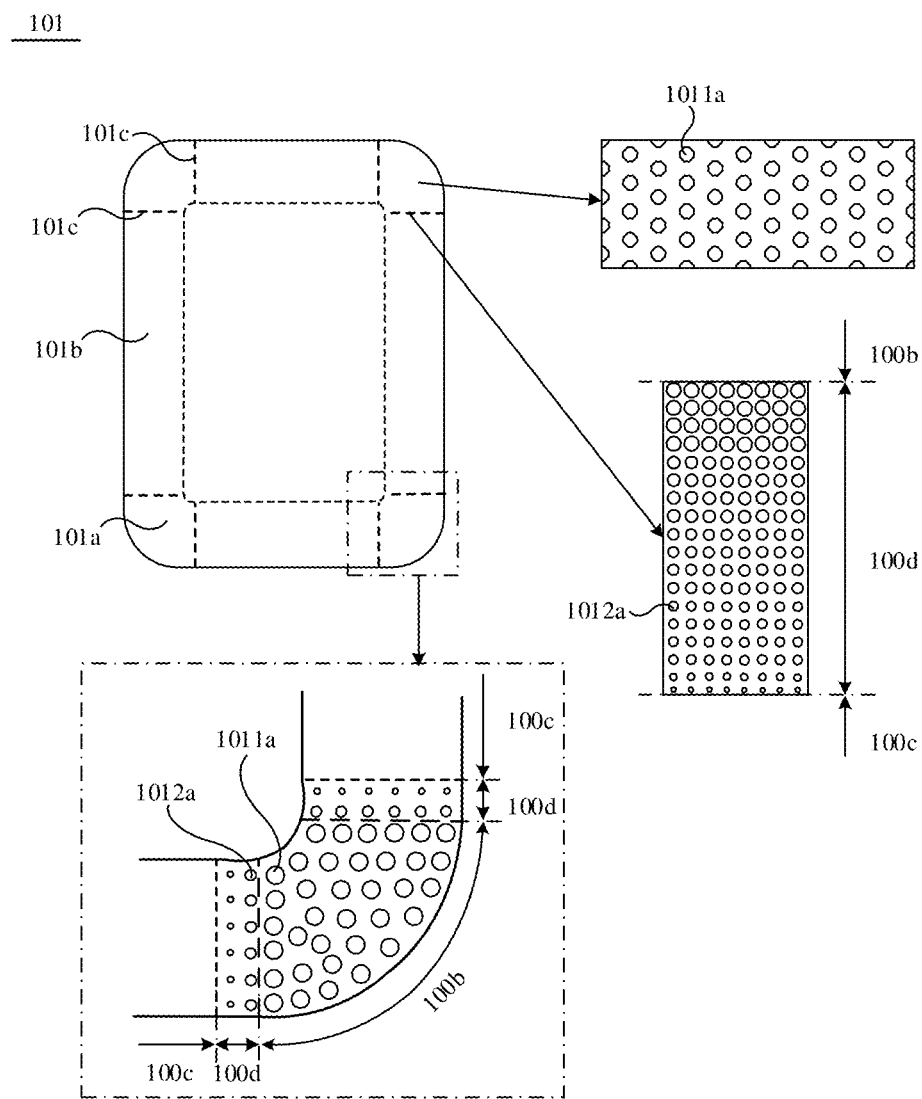
FIG. 2A and FIG. 2B are two-dimensional structural schematic diagrams of a supporting layer according to an embodiment of the present application.
Figure 2B:
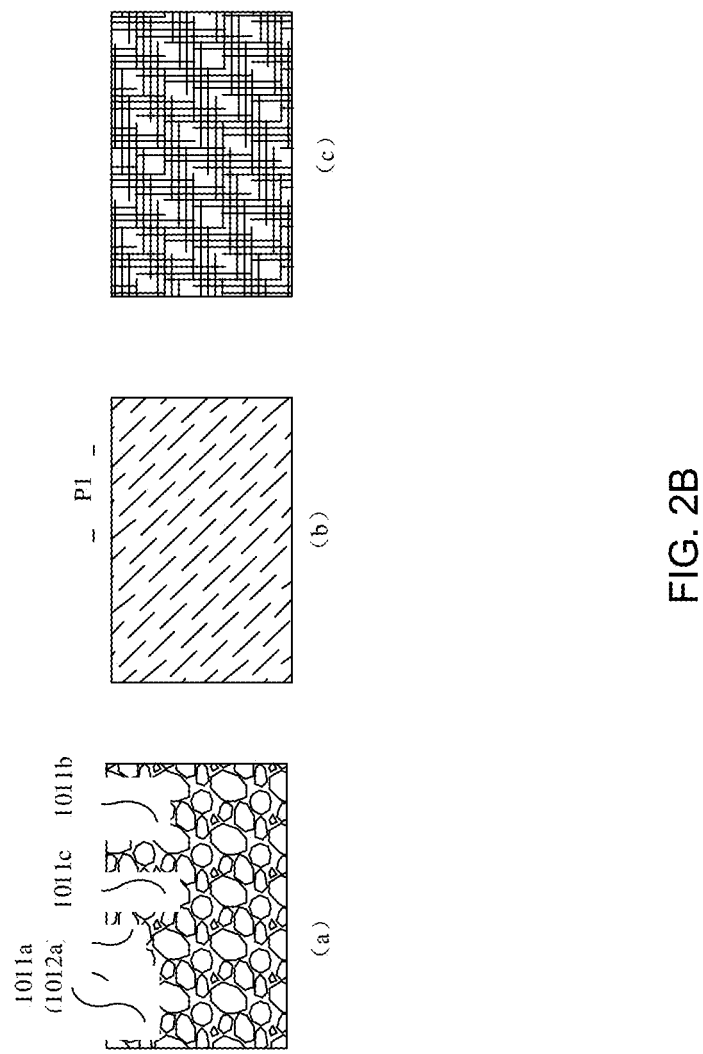

Further refer to figure (a) of FIG. 2A and FIG. 2B, the first structure comprises a plurality of first pores 1011a to make the material of the first portion 101a comprises a plurality of first pores 1011a.

Optionally, the first pores 1011a are uniformly distributed to provide a similar shrinkage rate throughout the first portion 101a.

Optionally, the first pores 1011a adopts closed-pore structure design or open-pore structure design. Further, the first pores 1011a adopting the open-pore structure refer to the first pores 1011a are interconnected to each other to make the gas circulate among the pores. Compared with the first pores 1011a adopting the closed-pore structure design, the first pores 1011a adopting the open-pore structure design have better compression performance, air permeability and softness.

The base material of the supporting layer 101 comprises rubber or silica gel. During the manufacturing process, foaming agent can be added to the part of the base material corresponding to the first curved region 100b to make the part of supporting layer 101 corresponding to the first curved region 100b forming the first structure with the first pores 1011a. It could be understood that the structure, pore diameter, and distribution density of the first pores 1011a are determined by the factors such as dose, type and/or foaming process of the foaming agent, which will not be repeated herein. Optionally, the laser drilling process can be used to make the first porosity 1011a interconnected to form the open-pore structure design; the laser source used in the laser drilling process is less than or equal to 1 micrometer (μm) in diameter.

Further, since the pore diameter of the first pores are the same, no local adjustments are required for the kind, the dose, and the parameters of the foaming process used in different areas of the foaming agent in the first portion 101a, so as to reduce the difficulty of the process. The foaming agent comprises organic foaming agent (e.g., Diazo compound) and inorganic foaming agent (e.g., carbonate).

Optionally, the thickness of the base material of the supporting layer 101 is less than or equal to 300 μm to reduce the impact of the thickness of the base material on the shrinkage performance of the first portion 101a. Further, the thickness of the base material of the supporting layer 101 is greater than or equal to 80 micrometers and less than or equal to 300 microns. Optionally, the thickness of the base material of the supporting layer 101 is equal to 80 μm, 90 μm, 95 μm, 100 μm, 120 μm, 150 μm, 180 μm, 200 μm, 225 μm, 250 μm, 275 μm, 290 μm, or 300 μm.

Optionally, the pore diameter of each first pore 1011a is less than or equal to 0.1 times the thickness of the supporting layer 101. The shape of each first pore 1011a is not limited to circle, oval or polygon; the center distance of the two adjacent first pores 1011a is 2 to 5 times of the pore diameter of the first pores 1011a. For example, the center distance of the two adjacent first pores 1011a can be 2, 2.5, 3, 3.5, 4, 4.5 or 5 times of the pore diameter of the first pores 1011a, so that the shrinkage rate of the first portion 101a meets product requirements (e.g., a 20% shrinkage rate).

Further refer to the figure (a) in FIG. 2B, the pore diameter of the first pores can be different; specifically, the first pores 1011a comprises a first sub-pore 1011b having a minimum pore diameter and a second sub-pore 1011c having a maximum pore diameter, wherein the minimum pore diameter is 10% to 50% of the maximum pore diameter. The center distance of two adjacent second sub-pores is 2 to 5 times of the pore diameter of the maximum pore diameter, so that the shrinkage rate of the first portion 101a meets product requirements (e.g., a 20% shrinkage rate).

Due to the shrinkage and deformation of the first pores 1011a during 3D adhesive process, the exhaust shrinkage of the first portion 101a to make the panel main body 102 at the first curved region 100b is tightly adhesive to the curved cover plate 103, and thus an arc surface is formed at the first curved region 100b corresponding to the display panel being processed by the 3D adhesive process. Therefore, simulation analysis can be performed based on the shape information (e.g., curvature) of the first curved region 100b that could be obtained after 3D adhesive process, so that the design parameters such as the pore diameter, pore spacing, and distribution density of the first pore 1011a can be obtained, which will not be repeated herein.

It can be understood that after the 3D adhesive process of the display panel, the greater the curvature of the arc surface of the first curved region 100b required by the display panel, the larger the pore diameter of the first pores 1011a included in the material of the corresponding first portion 101a, and the higher the distribution density. After the 3D adhesive process of the display panel, the smaller the bending degree of arc of the first curved region 100b required by the display panel, the smaller the pore diameter of the first pores 1011a included in the corresponding first portion 101a, and the lower the distribution density, so that the area, with greater curvature, of the first portion 101a corresponding to the arc of the first curved region 100b have a greater shrinkage rate.

Further refer to figure (b) in FIG. 2B, the first structure is a regular first skeletal structure, and the first skeletal structure shrinks and deforms along with the shrinkage of the first portion 101a. Further, before and after the shrinkage of the first skeletal structure, the variation amplitude of the distance P1 between two adjacent skeletal structures in the first skeletal structure is less than or equal to 50%. For example, before the shrinkage of the first skeletal structure, the distance P1 between two adjacent skeletons in the first skeletal structure is 50 μm. After the shrinkage of the first skeletal structure, the distance P1 between two adjacent skeletons in the first skeletal structure changes to 25 μm. It could be understand that the variation amplitude, before and after the shrinkage, of the distance P1 between two adjacent skeletons in the first skeletal structure is related to the shrinkage rate required by the display panel. Specifically, if the shrinkage rate required by the display panel is large, the distance P1 between two adjacent skeletons in the first skeletal structure has a large variation amplitude, before and after the shrinkage. If the shrinkage rate required by the display panel is small, the distance P1 between two adjacent skeletons in the first skeletal structure has a small variation amplitude, before and after the shrinkage. There is a base material disposed between two adjacent skeletons in the first skeletal structure, which comprises rubber, silica gel, or silicone rubber. The materials used to form the skeletons in the first skeletal structure include glass fiber, ceramic fiber, etc. The manufacturing methods for forming the first skeletal structure in the supporting layer 101 include calendering method or immersion method.

Further refer to figure (c) in FIG. 2B, the first structure is an irregular first fiber structure that shrinks and deforms along with the first portion 101a. Before and after the shrinkage of the first fiber structure, the variation amplitude of the size of the first fiber structure is related to the shrinkage rate required by the display panel. Specifically, if the shrinkage rate required by the display panel is large, the variation amplitude, before and after the shrinkage, of the size of the first fiber structure is large. If the shrinkage rate required by the display panel is small, the variation amplitude, before and after the shrinkage, of the size of the first fiber structure is also small.

Further refer to FIG. 1A and FIG. 1B, since the second curved region 100c has a relatively single bending direction compared to that of the first curved region 100*b* after 3D adhesive process, the second curved region 100*c* may not shrink. That is, the second portion 101*b* is required to meet the requirements of bending deformation only when performing the 3D adhesive process to the display panel.

In order to realize the transition change of the bending degree of the first curved region 100*b* and the second curved region 100*c*, the display panel further comprises a transition region 100*d* located between the first curved region 100*b* and the second curved region 100*c*. The supporting layer 101 comprises a third portion 101*c* corresponding to the transition region 100*d*. The shrinkage rate of the third portion 101*c* is less than that of the first portion 101*a*, and greater than that of the second portion 101*b*.

Further, the third portion 101*c* comprises a second structure.

Optionally, the second structure comprises a porous structure, a regular skeletal structure, or an irregular fibrous structure. In order to reduce the manufacturing difficulty of the display panel, the first structure and the second structure can adopt the same structural type, that is, both the first structure and the second structure can be implemented by the porous structure, the regular skeletal structure, or the irregular fiber structure.

Specifically, further refer to FIG. 2A, which takes the second structure implementing by the porous structure as an example, the second structure comprises a plurality of second pores 1012, and the porosity of the first portion 101*a* is greater than that of the third portion 101*c*.

Further, the pore diameter of each second pore 1012*a* is less than that of each first pore 1011*a*, so that the shrinkage rate of the third portion 101*c* is less than that of the first portion 101*a*.

Optionally, the second pores 1012 are uniformly distributed. Optionally, the distribution density of the second pores 1012*a* gradually decreases in the direction from the first curved region 100*b* to the second curved region 100*c*, so as to gradually decrease the shrinkage rate of the third portion 101*c* in the direction from the first curved region 100*b* to the second curved region 100*c*.

Further, in the transition region 100*d*, the pore diameter of the second pores 1012*a* gradually decreases in the direction from the first curved region 100*b* to the second curved region 100*c*, so as to gradually decrease the shrinkage rate of the third portion 101*c* in the direction from the first curved region 100*b* to the second curved region 100*c*.

Optionally, the second pores 1012*a* adopts closed-pore structure design or open-pore structure design. Further, the second pores 1012 adopting the closed-pore structure design make the shrinkage rate of the third portion 101*c* less than that of the first portion 101*a*.

Optionally, the second pores 1012 could have the same or different pore diameter. Specifically, in the third portion 101*c*, the second pores comprise a third sub-pore having a minimum pore diameter and a fourth sub-pore having a maximum pore diameter, wherein the minimum pore diameter is 10% to 50% of the maximum pore diameter. The center distance of two adjacent fourth sub-pores is 2 to 5 times of the pore diameter of the maximum pore diameter. The structure, pore diameter, and distribution density of the second pores 1012*a* are determined by the factors such as dose, type and/or foaming process of the foaming agent, which will not be repeated herein. The second structure comprises a plurality of of the second pores 1012*a* having different pore diameter which have the structure similar to the first pores 1011*a* in the first structure as shown in figure (a) of FIG. 2B, where the first pores 1011*a* also have different pore diameter.

When the second structure is a regular skeletal structure or an irregular fiber structure, the structural type of the second structure is similar to those of the first structure, implemented by the regular skeletal structure or the irregular fiber structure, shown in figures (b) and (c) of FIG. 2B.

Specifically, the second structure is a regular first skeletal structure, and the second skeletal structure shrinks and deforms along with the shrinkage of the third portion 101*c*. Further, the variation amplitude, before and after the shrinkage of the second skeletal structure, of the distance between two adjacent skeletal structures in the second skeletal structure is less than the variation amplitude, before and after the shrinkage of the first skeletal structure, of the distance between two adjacent skeletal structures in the first skeletal structure, so that the shrinkage rate of the first portion 101*a* is greater than that of the third portion 101*c*. Further, before performing the 3D adhesive process to the display panel, the distance between two adjacent skeletons in the second skeletal structure gradually decreases in the direction from the first curved region 100*b* to the second curved region 100*c*, so as to gradually decrease the shrinkage rate of the third portion 101*c* in the direction from the first curved region 100*b* to the second curved region 100*c*. When performing the 3D adhesive process to the display panel, the variation amplitude, before and after shrinkage of the second skeletal structure, of the distance between two adjacent skeletons in the second skeletal structure gradually decreases in the direction from the first curved region 100*b* to the second curved region 100*c*, so as to gradually decrease the shrinkage rate of the third portion 101*c* in the direction from the first curved region 100*b* to the second curved region 100*c*. There is a base material disposed between two adjacent skeletons in the second skeletal structure, which comprises rubber, silica gel, or silicone rubber. The materials used to form the skeletons in the second skeletal structure include glass fiber, ceramic fiber, etc. The manufacturing methods for forming the second skeletal structure in the supporting layer 101 include calendering method or immersion method.

Specifically, the second structure is an irregular second fiber structure that shrinks and deforms along with the third portion 101*c*. Further, before and after the shrinkage of the second fiber structure, the variation amplitude of the size of the second fiber structure is less than that of the first fiber structure, so that the shrinkage rate of the first portion 101*a* is greater than that of the third portion 101*c*. Further, the size of the second fiber structure gradually decreases in the direction from the first curved region 100*b* to the second curved region 100*c*, so as to gradually decrease the shrinkage rate of the third portion 101*c* in the direction from the first curved region 100*b* to the second curved region 100*c*.

Further refer to FIG. 1A and FIG. 1B, before performing the 3D adhesive process to the display panel, the supporting layer 101 and the panel main body 102 are in a flat state. After the 3D adhesive process is completed, the first portion 101*a* in the first curved region 100*b* shrinks and the third portion 101*c* in the transition region 100*d* shrink. Since the shrinkage performance of the third portion 101*c* is weaker than that of the first portion 101*a* and the shrinkage performance of the second portion 101*b* is weaker than that of the third portion 101*c*, the panel main body 102 and the curved cover plate 103 can be tightly adhesive. The first curved region 100*b* and the second curved region 100*c* are curved surfaces, which can improve the wrinkles issue or the cutting joint issue easily existing in the first curved region 100b when the 3D adhesive process of the display panel is completed. Optionally, the material for manufacturing the curved cover plate 103 comprises glass.

Figure 3A:
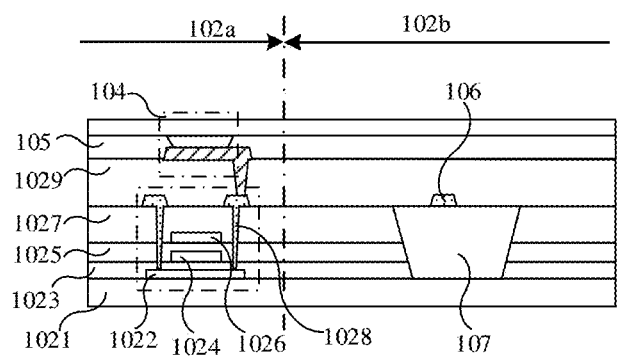
FIG. 3A and FIG. 3B are structural diagrams of a panel main body according to an embodiment of the present application.
Figure 3B:
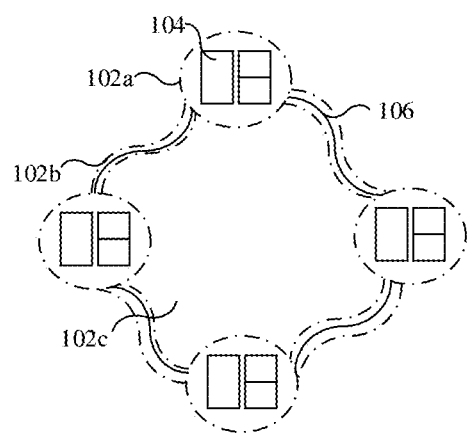

As shown in FIG. 3A and FIG. 3B, which are structural diagrams of a panel main body according to an embodiment of the present application. The panel main body 102 comprises an array substrate. The array substrate comprises a substrate 1021 and a driving array layer located on the substrate 1021, which is made of polyimide or plastic flexible material. The supporting layer 101 is located under the substrate 1021 and configured to support the substrate 1021.

Optionally, the drive array layer comprises an active layer 1022 located on the substrate 1021, a first insulating layer 1023 covering the active layer 1022, a first metal layer 1024 disposed on the first insulating layer 1023, a second insulating layer 1025 covering the first metal layer 1024, a second metal layer 1026 disposed on the second insulating layer 1025, an interlaminar medium layer 1027 covering the second metal layer 1026, a third metal layer 1028 disposed on the interlaminar medium layer 1027, and a flat layer 1029 covering the third metal layer 1028. The first metal layer 1024 comprises a gate electrode disposed corresponding to the active layer 1022, the second metal layer 1026 comprises an electrode portion disposed corresponding to the gate electrode, the third metal layer 1028 comprises a source electrode and a drain electrode electrically connected to the active layer 1022.

Optionally, the display panel comprises a passive light emitting display panel or an active light emitting display panel. Further, the passive light emitting display panel comprises a liquid crystal display (LCD) panel, and the array substrate further comprises a pixel electrode, or a pixel electrode and a common electrode. The panel main body 102 further comprises a color film substrate and a liquid crystal molecule located between the array substrate and the color film substrate. The color film substrate comprises a plurality of color film units. Further, the LCD panel further comprises a backlight source configured to provide a backlight for the panel main body 102. In order to avoid the backlight emitting by the backlight module for the panel main body 102 affected by the supporting layer 101, the backlight source is located between the panel main body 102 and the supporting layer 101.

Optionally, the color film unit comprises perovskite material, fluorescent material, or quantum dot material.

Further refer to FIG. 3A and FIG. 3B, the display panel is an active light emitting display panel. The panel main body 102 further comprises a light emitting device 104, wherein the light emitting device 104 comprises organic light emitting diode (OLED), Mini LED, or Micro LED.

Further, the light emitting device 104 comprises an anode, a cathode, and a light emitting layer located between the anode and the cathode. The panel main body 102 further comprises a pixel definition layer 105, and the light emitting layer is located within the pixel definition area of the pixel definition layer 105. Optionally, the light-emitting device 104 is an inverted OLED or a positive-type LED. Optionally, the luminescent layer comprises a perovskite material, a fluorescent material, or a quantum dot material.

Further refer to FIG. 3B, the panel main body 102 comprises a plurality of separated island region 102a, hinge region 102b and intermediate region 102c. The hinge region 102b is connected to a plurality of the island region 102a, and the intermediate region 102c is surrounded by the hinge region 102b and the island region 102a. The panel main body 102 comprises a plurality of display units and a connecting unit 106, each display unit is located in the island region 102a and comprises a plurality of light emitting devices 104. The connecting unit 106 is connected to a plurality of the display units, and the connecting unit 106 is located in the corresponding hinge region 102b.

Further, the connecting unit 106, the source electrode, and the drain electrode are at the same layer. In a top view, the connecting unit 106 is wavy or arc-shaped, so that the panel main body 102 has certain tensile properties corresponding to the first portion 101a and the third portion 101c during the 3D adhesive process of the display panel.

The array substrate comprises an organic polymer material located in the intermediate region 102c. Specifically, the array substrate comprises an organic polymer material, which is formed by removing the first insulating layer 1023, the second insulating layer 1025, and the interlaminar medium layer 1027 located in the intermediate region 102c, and then filling the intermediate region 102c with organic polymer materials during the manufacturing process of the display panel, located in the intermediate region 102c. Optionally, the organic polymer material comprises polydimethylsiloxane.

The array substrate comprises an organic filling layer 107 located in the hinge region 102b. Specifically, the connecting unit 106 is located on the organic filling layer 107 by removing the first insulating layer 1023, the second insulating layer 1025, and the interlaminar medium layer 1027 in the hinge area 102b, and then filling the organic filling layer 107 in the hinge region 102b during the manufacturing process of the display panel. The organic filling layer 107 is configured to reduce bending stress.

Optionally, since the supporting layer 101 is located below the substrate 1021, a patterned design can be used for the substrate 1021. Specifically, the substrate 1021 is only located in the island region 102a, and the organic polymer material is located in the intermediate region 102c and through the holes of the substrate 1021, the first insulating layer 1023, the second insulating layer 1025, and the interlaminar medium layer 1027. The organic filling layer 107 is located in the hole through the substrate 1021, the first insulating layer 1023, the second insulating layer 1025, and the interlaminar medium layer 1027 in the hinge region 102b, so as to reduce the impact of the bending performance and the tensile performance caused by the substrate 1021 while the supporting layer 101 provides a complete support for the panel main body 102.

It could be understood that the display panel could further comprise a polarizer, a touch electrode, and a sensor which are not shown in the figures. Optionally, the sensor comprises a fingerprint sensor, a camera, a distance sensor, etc.

The present application further provides a display device comprising any of the above-mentioned display panels.

The display device comprises a fixed terminal (e.g., a television, a desktop computer, etc.), a mobile terminal (e.g., a mobile phone, a laptop computer, etc.), and a wearable device (e.g., a bracelet, a virtual display device, an enhanced display device, etc.)

Specific exemplary embodiments are used to explain the principle and implementation of the present application in the disclosure. However, the above embodiments are intended merely to assist in understanding the present application. It can be understood that those having ordinary skills of the art may easily contemplate various changes and modifications of the technical solution and technical ideas of the present application. In summary, the contents in the specification should not be considered as a limitation of the present application.

What is claimed is:

1. A display panel, comprising a planar region, a first curved region, two second curved regions and a transition region, wherein the planar region comprises a first side and a second side adjacent to the first side, the two second curved regions are respectively coupled to the first side and the second side, and the first curved region is located between the two curved regions and corresponding to a corner area of the planar region; the transition region located between the first curved region and the second curved regions; the display panel further comprises:
   a supporting layer, comprising a first portion being bent and within the first curved region, a second portion being bent and within the second curved region, and a third portion being bent and within the transition region; and
   a panel main body, disposed on the first portion, the second portion, and the third portion and bent along with the first portion, the second portion, and the third portion;
   wherein the first portion has a first structure, the third portion has a second structure, the first structure comprises a plurality of first pores, and the second structure comprises a plurality of second pores, a porosity of the first portion per unit volume is greater than a porosity of the third portion, and a shrinkage rate of the third portion is less than the shrinkage rate of the first portion and is greater than the shrinkage rate of the second portion.

2. The display panel as claimed in claim 1, wherein in the transition region, the pore diameter of a plurality of the second pores gradually decreases in the direction from the first curved region to the second curved region.

3. The display panel as claimed in claim 2, wherein the pore diameter of the first pores is less than or equal to 0.1 time of the thickness of the supporting layer.

4. The display panel as claimed in claim 1, wherein the pore diameter of each of the second pores is less than the pore diameter of each of the first pores.

5. The display panel as claimed in claim 4, wherein the first pores have the same pore diameter, and a center distance of two adjacent first pores is 2 to 5 times of the pore diameter of the first pores.

6. The display panel as claimed in claim 4, wherein the first pores have different pore diameter, and the first pores comprise a first sub-pore having a minimum pore diameter and a second sub-pore having a maximum pore diameter; wherein the minimum pore diameter is 10% to 50% of the maximum pore diameter, and a center distance of two adjacent second sub-pores is 2 to 5 times of the pore diameter of the maximum pore diameter.

7. The display panel as claimed in claim 1, wherein in the transition region, the shrinkage rate of the third portion gradually decreases in the direction from the first curved region to the second curved region.

8. The display panel as claimed in claim 1, wherein the first structure and the second structure are regular skeletal structures.

9. The display panel as claimed in claim 8, wherein the first structure comprises a first skeletal structure, and the second structure comprises a second skeletal structure; wherein the variation amplitude of a distance between two adjacent skeletons in the second skeletal structure before and after shrink is less than that of in the first skeletal structure.

10. The display panel as claimed in claim 9, wherein the distance between two adjacent skeletons in the second skeletal structure gradually decreases in the direction from the first curve region to the second curved region.

11. The display panel as claimed in claim 9, wherein the variation amplitude of the distance between two adjacent skeletons in the first skeletal structure before and after shrink is less than or equal to 50%.

12. The display panel as claimed in claim 1, wherein the panel main body comprises:
   a substrate, located on the supporting layer;
   a driving array layer, located on the substrate; and
   a light emitting device, located on the driving array layer.

13. The display panel as claimed in claim 12, wherein the light emitting device comprises organic light emitting diode (OLED), Mini LED, or Micro LED.

14. A display device, comprising a display panel, wherein the display panel comprises a planar region, a first curved region, two second curved regions and a transition region, the planar region comprises a first side and a second side adjacent to the first side, the two second curved regions are respectively coupled to the first side and the second side, and the first curved region is located between the two curved regions and corresponding to a corner area of the planar region; the transition region located between the first curved region and the second curved regions; the display panel further comprises:
   a supporting layer, comprising a first portion being bent and within the first curved region, a second portion being bent and within the second curved region, and a third portion being bent and within the transition region; and
   a panel main body, disposed on the first portion, the second portion, and the third portion and bent along with the first portion, the second portion, and the third portion;
   wherein the first portion has a first structure, the third portion has a second structure, the first structure comprises a plurality of first pores, and the second structure comprises a plurality of second pores, a porosity of the first portion per unit volume is greater than a porosity of the third portion, and a shrinkage rate of the third portion is less than the shrinkage rate of the first portion and is greater than the shrinkage rate of the second portion.

15. The display device as claimed in claim 14, wherein in the transition region, the pore diameter of a plurality of the second pores gradually decreases in the direction from the first curved region to the second curved region.

16. The display device as claimed in claim 14, wherein the pore diameter of each of the second pores is less than the pore diameter of each of the first pores.

* * * * *